(12) United States Patent
Chen et al.

(10) Patent No.: US 10,483,937 B2
(45) Date of Patent: Nov. 19, 2019

(54) TRANSCEIVER CIRCUIT AND CONFIGURATION METHOD THEREOF

(71) Applicant: REALTEK SEMICONDUCTOR CORP., Hsinchu (TW)

(72) Inventors: Jian-You Chen, New Taipei (TW); Cheng-Wei Luo, Hsinchu (TW); Kuan-Yu Shih, New Taipei (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/144,255

(22) Filed: Sep. 27, 2018

(65) Prior Publication Data
US 2019/0165751 A1 May 30, 2019

(30) Foreign Application Priority Data

Nov. 27, 2017 (TW) ............................. 106141234 A

(51) Int. Cl.
*H03H 7/01* (2006.01)
*H04B 1/10* (2006.01)

(52) U.S. Cl.
CPC ......... *H03H 7/0115* (2013.01); *H04B 1/1027* (2013.01); *H03H 2007/013* (2013.01); *H04B 2001/1063* (2013.01)

(58) Field of Classification Search
CPC ....... H03H 7/0115; H03H 7/09; H03H 7/1027
See application file for complete search history.

(56) References Cited

U.S. PATENT DOCUMENTS

| | | | | |
|---|---|---|---|---|
| 5,717,381 A * | 2/1998 | Jagielinski | ......... | G08B 13/2434 340/551 |
| 8,664,955 B1 * | 3/2014 | Halpern | ................ | G01R 33/60 324/316 |
| 2012/0064835 A1 * | 3/2012 | Wang | ...................... | H01P 1/127 455/73 |
| 2014/0065980 A1 * | 3/2014 | Ueki | ........................ | H03H 7/38 455/73 |
| 2015/0302971 A1 * | 10/2015 | Wagman | ............. | H01F 27/2804 336/200 |
| 2017/0346342 A1 * | 11/2017 | Kim | ........................ | H02J 50/12 |

* cited by examiner

*Primary Examiner* — Keith Ferguson
(74) *Attorney, Agent, or Firm* — Muncy, Geissler, Olds & Lowe, P.C.

(57) ABSTRACT

A transceiver circuit including: a substrate; a signal coupler configured on the substrate and including a coiled first conductive layer pattern; and a notch filter configured on the substrate and including a coiled second conductive layer pattern; wherein each of the first conductive layer pattern and the second conductive layer pattern is arranged as a substantially symmetrical pattern with respect to a first virtual axis.

18 Claims, 15 Drawing Sheets

US 10,483,937 B2

TRANSCEIVER CIRCUIT AND CONFIGURATION METHOD THEREOF

CROSS-REFERENCE TO RELATED APPLICATION

This application claims priority from Taiwan Application No. 106141234, filed on Nov. 27, 2017, in the Taiwan Intellectual Property Office, the content of which is hereby incorporated by reference in their entirety for all purposes.

BACKGROUND OF THE INVENTION

Field of the Invention

The present invention relates to a transceiver circuit and the configuration method thereof, more specifically, relates to a transceiver circuit which includes a notch filter and the configuration method thereof Description of the Related Art Due to the rareness of the spectrum and the corresponding laws, a transceiver cannot disturb other spectrum bands while transmitting signals. For example, a transceiver operating at 2.4 GHz generates second harmonics and third harmonics which may influence other spectrum bands.

According to the prior art, for example, the second harmonics are suppressed by increasing the symmetry of the structure of the chip and the third harmonics are suppressed by configuring a filter (referring to FIG. 9, the notch filter 902) including inductors and capacitors. However, additional regions of the chip are used to configure the inductor of the filter and the symmetry of the circuit layout is hence reduced (referring to FIG. 8, the notch filter 802 corresponding to the notch filter 902 of FIG. 9).

SUMMARY OF THE INVENTION

In view of the aforementioned problems of the prior art, the present invention provides a transceiver circuit and configuration method thereof. Main components of a harmonic wave filter are integrated with the passive components of the original design so as not to use additional regions of the chip and not to increase the asymmetry of the original design.

The present invention discloses a transceiver circuit including: a substrate; a signal coupler configured on the substrate and including a coiled first conductive layer pattern; and a notch filter configured on the substrate and including a coiled second conductive layer pattern; wherein each of the first conductive layer pattern and the second conductive layer pattern is arranged as a substantially symmetrical pattern with respect to a first virtual axis.

Another disclosure of the present invention is a method of transceiver circuit configuration, which includes: (A) configuring a signal coupler on a substrate, the signal coupler including a coiled first conductive layer pattern; (B) configuring a notch filter on the substrate, the notch filter including a coiled second conductive layer pattern; wherein each of the first conductive layer pattern and the second conductive layer pattern is arranged as a substantially symmetrical pattern with respect to a first virtual axis.

DETAILED DESCRIPTION OF THE PREFERRED EMBODIMENTS

Figure 8:
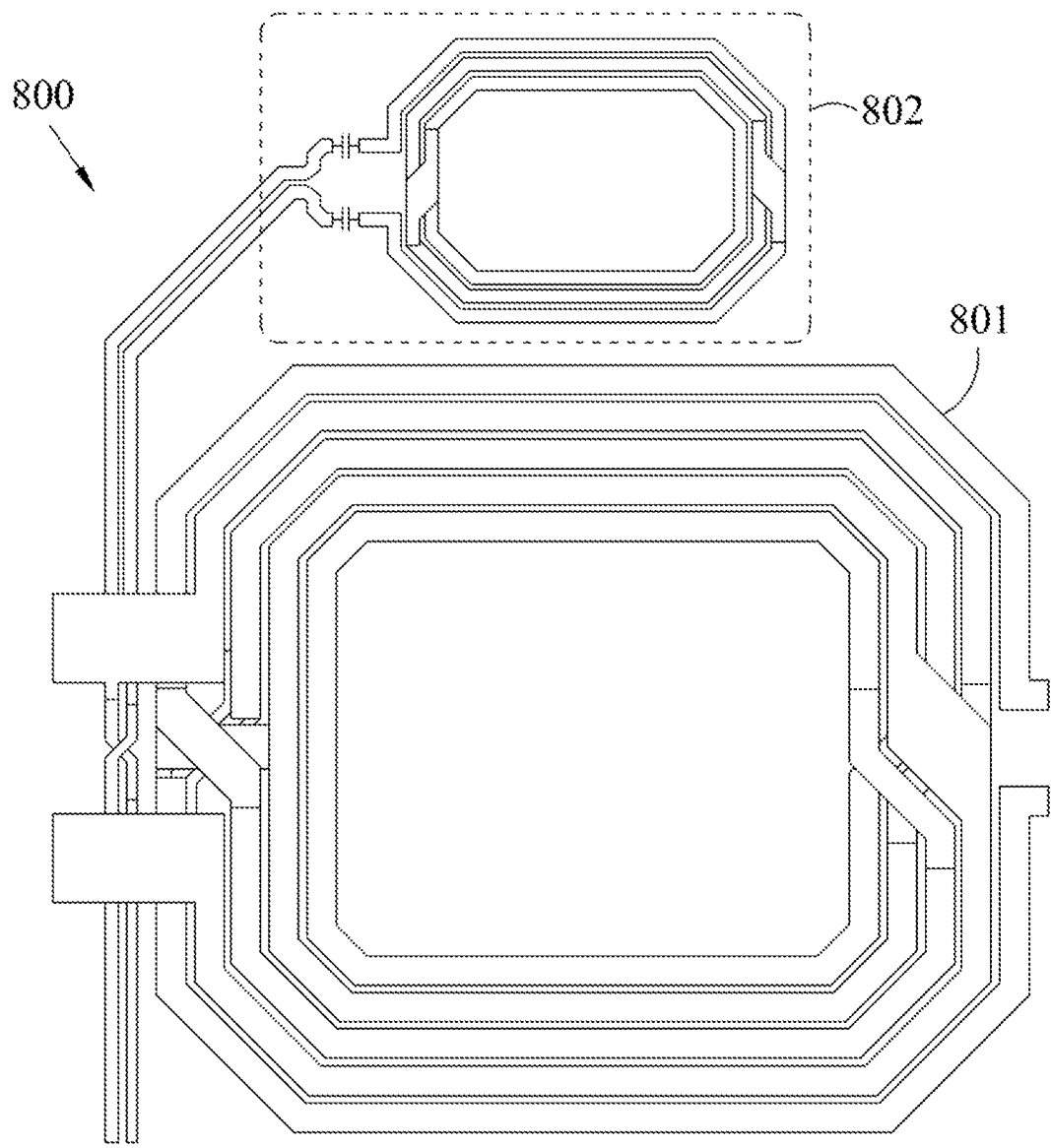
FIG. 8 illustrates a layout of a transceiver circuit according to the prior art as a control group.
Figure 9:
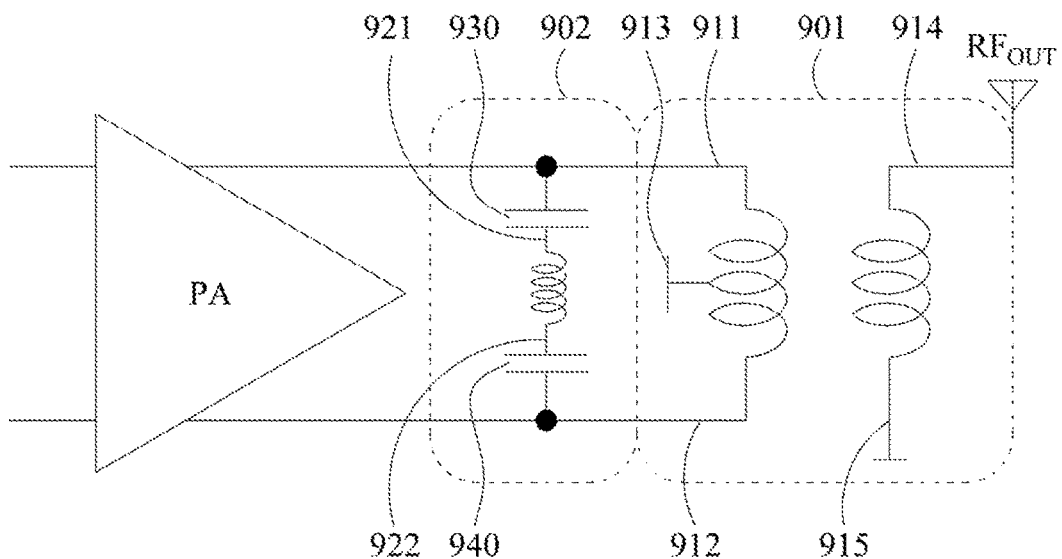
FIG. 9 illustrates a schematic diagram of a circuit of a transceiver circuit according to the prior art.

FIG. 9 illustrates a schematic diagram of a circuit of a transceiver circuit according to the prior art, and FIG. 8 illustrates a layout of a transceiver circuit according to the prior art as a control group. Layout of the symmetrical transceiver circuits of the first embodiment to the sixth embodiment of the present invention are provided hereinafter. Further, FIG. 9 also illustrates the schematic diagram of each of the circuits of the transceiver circuits of the first embodiment to the fifth embodiment if the power amplifier (PA) and the radio frequency output terminal ($RF_{out}$) in FIG. 9 are omitted.

Figure 1A:
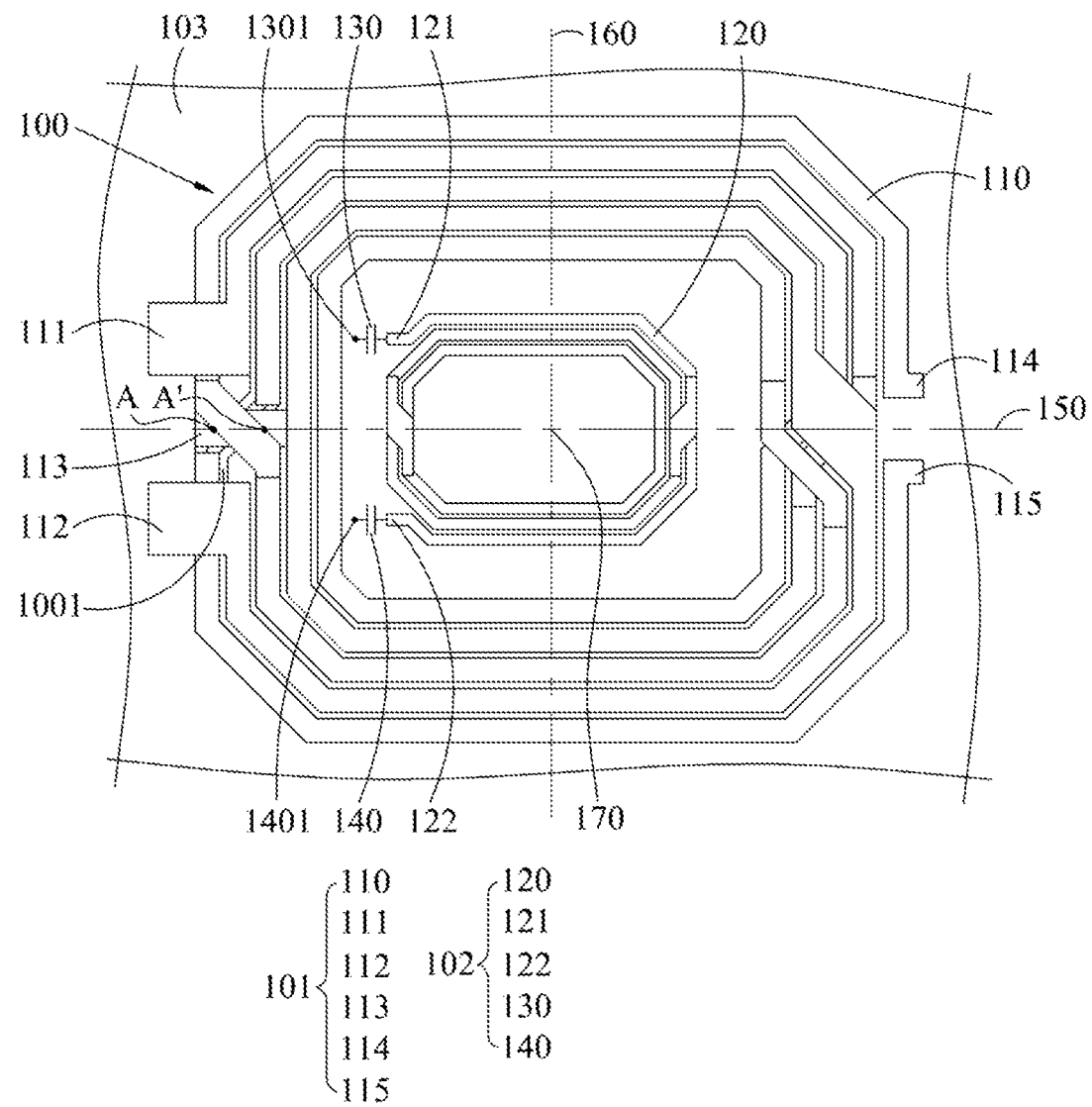
FIG. 1A illustrates a layout of the transceiver circuit according to the first embodiment of the present invention.

Referring to FIG. 1A, which illustrates the layout of the transceiver circuit 100 according to the first embodiment of the present invention. The transceiver circuit 100 includes the signal coupler 101, the notch filter 102 and the substrate 103. The signal coupler 101 is configured on the substrate 103 and includes the first conductive layer pattern 110. The coiled first conductive layer pattern 110 is configured on the substrate 103 and includes the first end 111, the second end 112, the fifth end 113, the sixth end 114 and the seventh end 115.

The fifth end 113 corresponds to the feed-in point 913 of PA current on the primary side shown in FIG. 9. The sixth end 114 corresponds to the output point 914 of the RF signal on the secondary side shown in FIG. 9. The seventh end 115 corresponds to the grounding 915 on the secondary side shown in FIG. 9.

Referring to FIG. 1A and FIG. 9, the signal coupler 101 and the notch filter 102 of FIG. 1A respectively correspond to the signal coupler 901 and the notch filter 902 of FIG. 9;

the first end 111, the second end 112, the fifth end 113, the sixth end 114 and the seventh end 115 of FIG. 1A respectively correspond to the first end 911, the second end 912, the fifth end 913, the sixth end 914 and the seventh end 915 of FIG. 9.

Figure 1B:
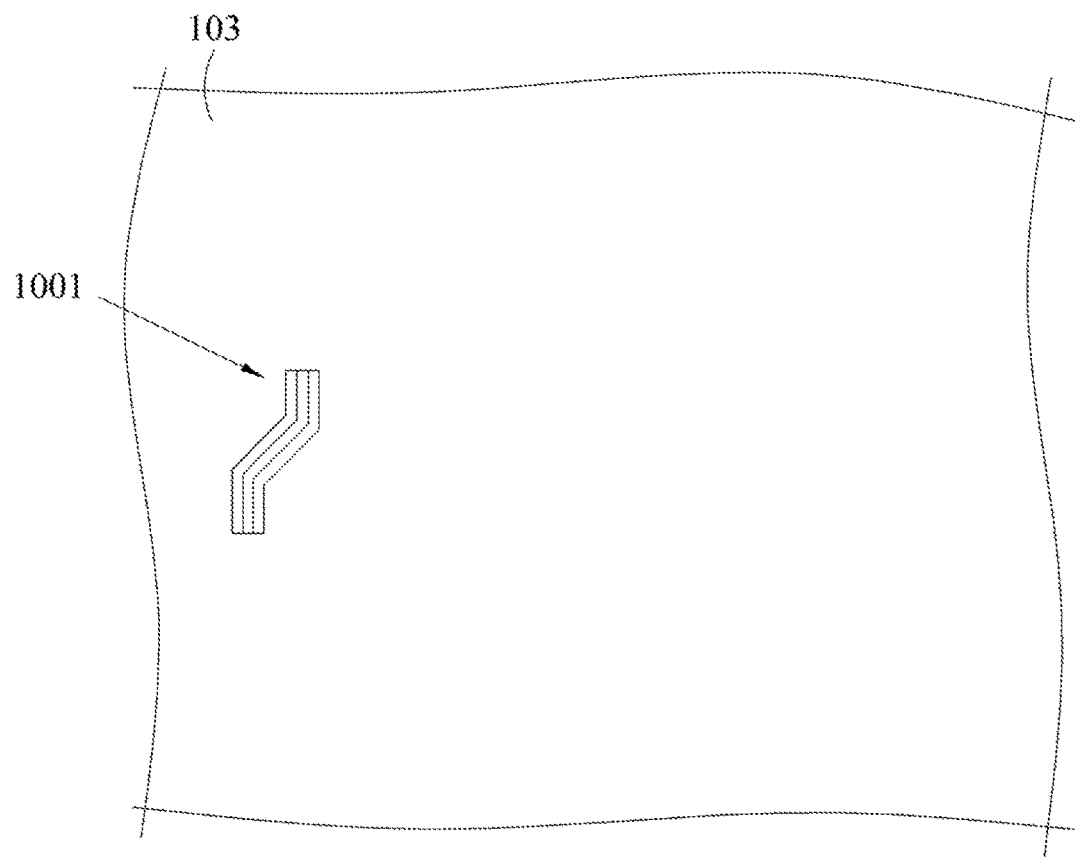
FIG. 1B illustrates a layout of the first layer of the transceiver circuit according to the first embodiment of the present invention.
Figure 1C:
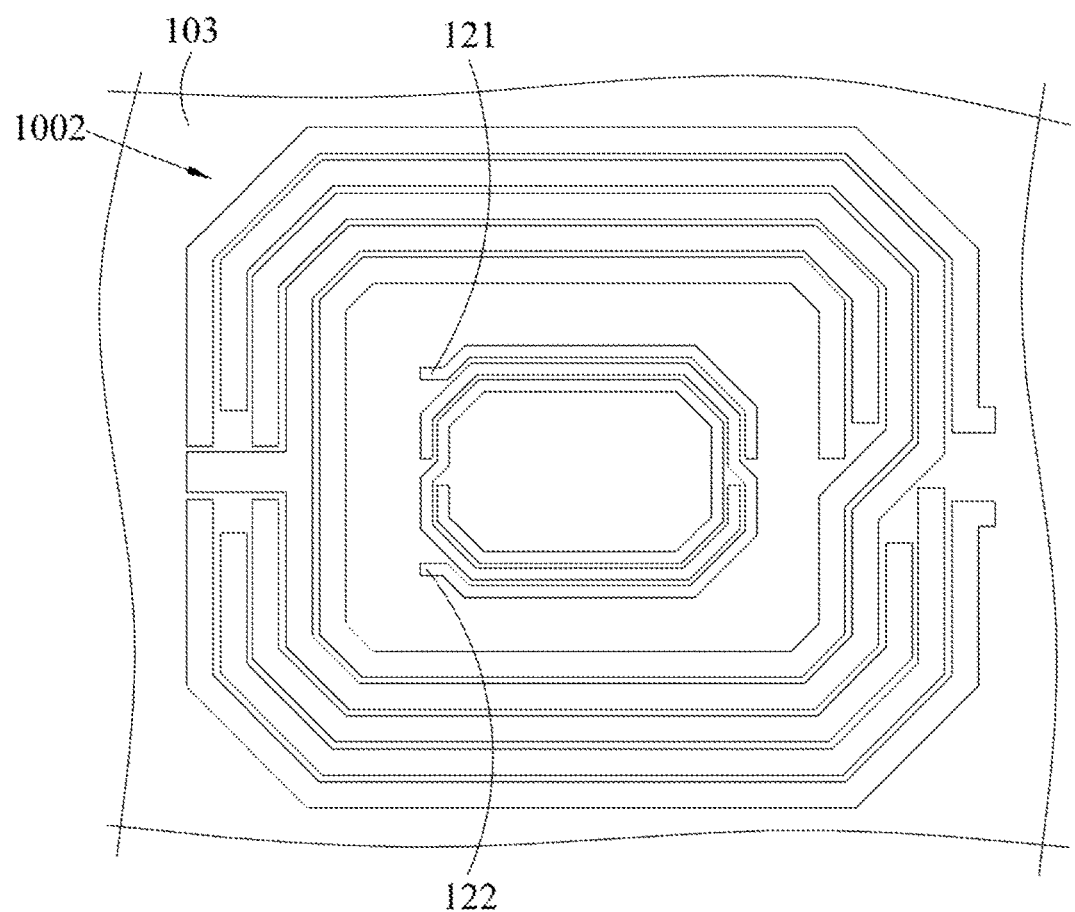
FIG. 1C illustrates a layout of the second layer of the transceiver circuit according to the first embodiment of the present invention.
Figure 1D:
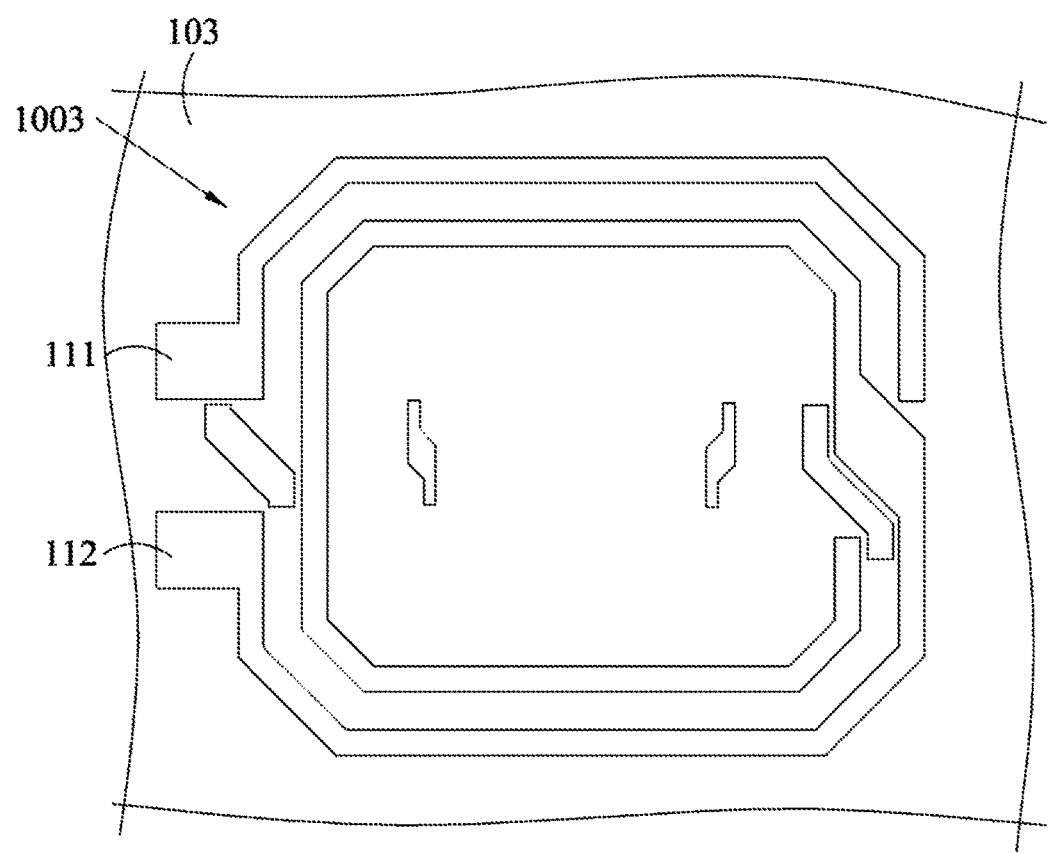
FIG. 1D illustrates a layout of the third layer of the transceiver circuit according to the first embodiment of the present invention.
Figure 1E:
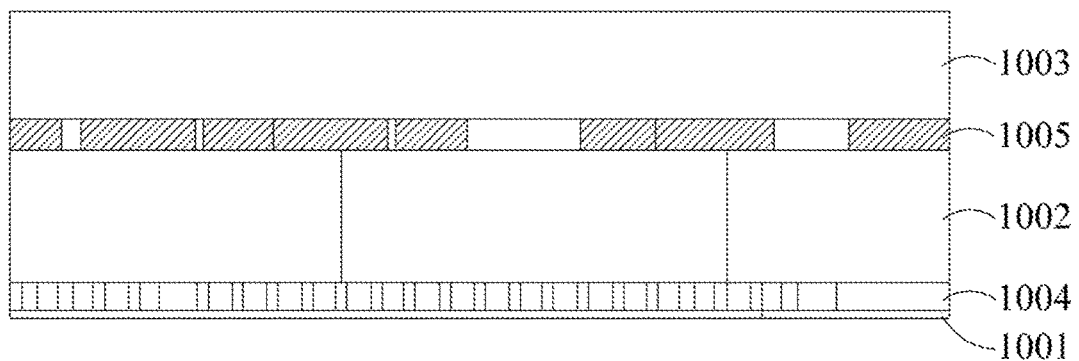
FIG. 1E illustrates a cross section diagram taken along line AA' in FIG. 1A.

The notch filter 102 is configured on the substrate 103 and includes the second conductive layer pattern 120. The coiled second conductive layer pattern 120 is configured on the substrate 103, wherein the substrate 103 may include a multilayer structure and the first conductive layer pattern 110 or the second conductive layer pattern 120 may be configured across different layers of the multilayer structure. Referring to FIGS. 1B to 1D, which illustrate layouts of each layer of the transceiver circuit, and referring to FIG. 1E, the first layer 1001 and the second layer 1002 of the transceiver circuit 100 are electrically connected to each other by the first conductive through hole layer 1004, and the second layer 1002 and the third layer 1003 of the transceiver circuit 100 are electrically connected to each other by the second conductive through hole layer 1005.

Referring to FIG. 1A again, the second conductive layer pattern 120 is configured in the first conductive layer pattern 110 in a plan view (top view). The second conductive layer pattern 120 includes the third end 121 and the fourth end 122.

The notch filter 102 further includes the first capacitor 130 and the second capacitor 140. One end of the first capacitor 130 is electrically connected to the third end 121 and the other end of the first capacitor 130 is electrically connected to the first end 111 by the foregoing multilayer structure. That is, the first capacitor 130 is electrically connected between the first end 111 and the third end 121. One end of the second capacitor 140 is electrically connected to the fourth end 122 and the other end of the second capacitor 140 is electrically connected to the second end 112 by the foregoing multilayer structure. That is, the second capacitor 140 is electrically connected between the second end 112 and the fourth end 122.

The notch filter 102, the third end 121, the fourth end 122, the first capacitor 130 and the second capacitor 140 thereof respectively correspond to the notch filter 902, the third end 921, the fourth end 922, the first capacitor 930 and the second capacitor 940 of FIG. 9.

As shown in FIG. 1A, each of the first conductive layer pattern 110 and the second conductive layer pattern 120 is arranged as a substantially symmetrical pattern with respect to the first virtual axis 150. Furthermore, each of the first conductive layer pattern 110 and the second conductive layer pattern 120 may also be arranged as a substantially symmetrical pattern with respect to the second virtual axis 160, and the second virtual axis 160 may be perpendicular to the first virtual axis 150.

In the present embodiment, the first conductive layer pattern 110 and the second conductive layer pattern 120 may be arranged as a substantially circular pattern with the same geometric center. More specifically, as shown in FIG. 1A, the first conductive layer pattern 110 and the second conductive layer pattern 120 may be arranged as a substantially symmetrical pattern with respect to the first virtual axis 150, the first conductive layer pattern 110 and the second conductive layer pattern 120 may be arranged as a substantially symmetrical pattern with respect to the second virtual axis 160, and the first conductive layer pattern 110 and the second conductive layer pattern 120 may be arranged as a substantially circular pattern with the same geometric center and the geometric center is the first virtual cross 170 at which the first virtual axis 150 and the second virtual axis 160 cross each other.

In the present embodiment, the first capacitor 130 and the second capacitor 140 may be configured in the first conductive layer pattern 110. As shown in FIG. 1A, the first capacitor 130 is electrically connected between the first end 111 and the third end 121 and is configured in the first conductive layer pattern 110, and the second capacitor 140 is electrically connected between the second end 112 and the fourth end 122 and is configured in the first conductive layer pattern 110. Referring to FIG. 1A, the first capacitor 130 and the second capacitor 140 may be arranged as a substantially symmetrical pattern with respect to the first virtual axis 150.

In the foregoing embodiment (referring to FIG. 1A), the second conductive layer pattern 120, the first capacitor 130 and the second capacitor 140 of the notch filter 102 are configured in the first conductive layer pattern, which reduces the use of additional regions of the chip in comparison with the prior art. That is, referring to FIG. 8, the notch filter 802 is configured outside the signal coupler 801 in the transceiver circuit 800, which uses additional regions of the chip. Moreover, because the first conductive layer pattern 110 and the second conductive layer pattern 120 are arranged as a substantially symmetrical pattern with respect to the first virtual axis 150 and the second virtual axis 160 with the same geometric center, and the geometric center is the first virtual cross 170 at which the first virtual axis 150 and the second virtual axis 160 cross each other, the symmetry of structure of the transceiver circuit 100 is hence increased.

The foregoing signal coupler 101 may be a balun, and the notch filter 102 may be a harmonic filter filtering the third harmonic of the transceiver circuit 100. Taking WiFi 2.4 GHz as an example, the notch filter 102 may be a notch filter filtering 7.2 GHz~7.5 GHz.

Figure 2:
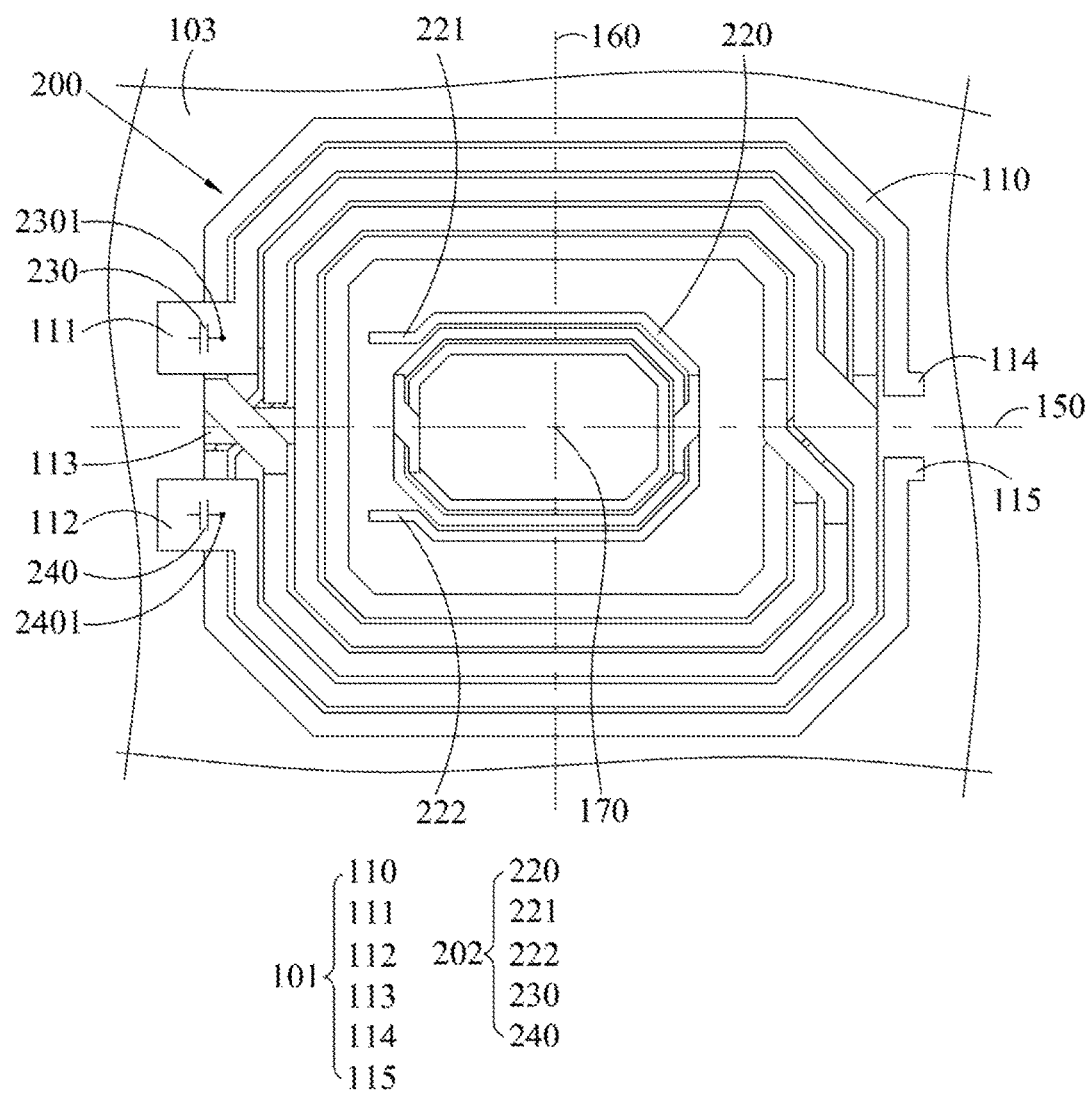
FIG. 2 illustrates a layout of the transceiver circuit according to the second embodiment of the present invention.

Referring to FIG. 2, which illustrates the layout of the transceiver circuit 200 according to the second embodiment of the present invention. The transceiver circuit 200 includes the signal coupler 101, the notch filter 202 and the substrate 103. The notch filter 202 is configured on the substrate 103 and includes the second conductive layer pattern 220. The coiled second conductive layer pattern 220 is configured on the substrate 103, wherein the substrate 103 may include a multilayer structure and the first conductive layer pattern 110 or the second conductive layer pattern 220 may be configured across different layers of the multilayer structure. The multilayer structure of the transceiver circuit 200 is similar to the foregoing multilayer structure of the transceiver circuit 100. Moreover, the second conductive layer pattern 220 is configured in the first conductive layer pattern 110 in a plan view (top view), and the second conductive layer pattern 220 includes the third end 221 and the fourth end 222.

The difference between the transceiver circuit 200 of the second embodiment and the transceiver circuit 100 of the first embodiment is the difference of the structure of the notch filter 202 and that of the notch filter 102, and the description of other portion of the transceiver circuits will be omitted. In the second embodiment, the first capacitor 230 and the second capacitor 240 of the notch filter 202 are configured outside the first conductive layer pattern 110 as a substantially symmetrical pattern with respect to the first virtual axis 150, wherein one end of the first capacitor 230 is electrically connected to the first end 111 and the other end 2301 of the first capacitor 230 is electrically connected to the third end 221 by the multilayer structure of the transceiver circuit 200. In other words, the first capacitor 230 is electrically connected between the first end 111 and the third end 221. One end of the second capacitor 240 is electrically connected to the second end 112 and the other end 2401 of the second capacitor 240 is electrically connected to the fourth end 222 by the multilayer structure of the transceiver circuit 200. That is, the second capacitor 240 is electrically connected between the second end 112 and the fourth end 222.

In the present embodiment (referring to FIG. 2), the second conductive layer pattern 220 of the notch filter 202 is configured in the first conductive layer pattern 110, which reduces the use of additional regions of the chip in comparison with the prior art. That is, referring to FIG. 8, the notch filter 802 is configured outside the signal coupler 801 in the transceiver circuit 800, which uses additional regions of the chip. Moreover, because each of the first conductive layer pattern 110 and the second conductive layer pattern 220 is arranged as a substantially symmetrical pattern with respect to the first virtual axis 150 and the second virtual axis 160 with the same geometric center, and the geometric center is the first virtual cross 170 at which the first virtual axis 150 and the second virtual axis 160 cross each other, the symmetry of structure of the transceiver circuit 200 is hence increased.

Figure 3:
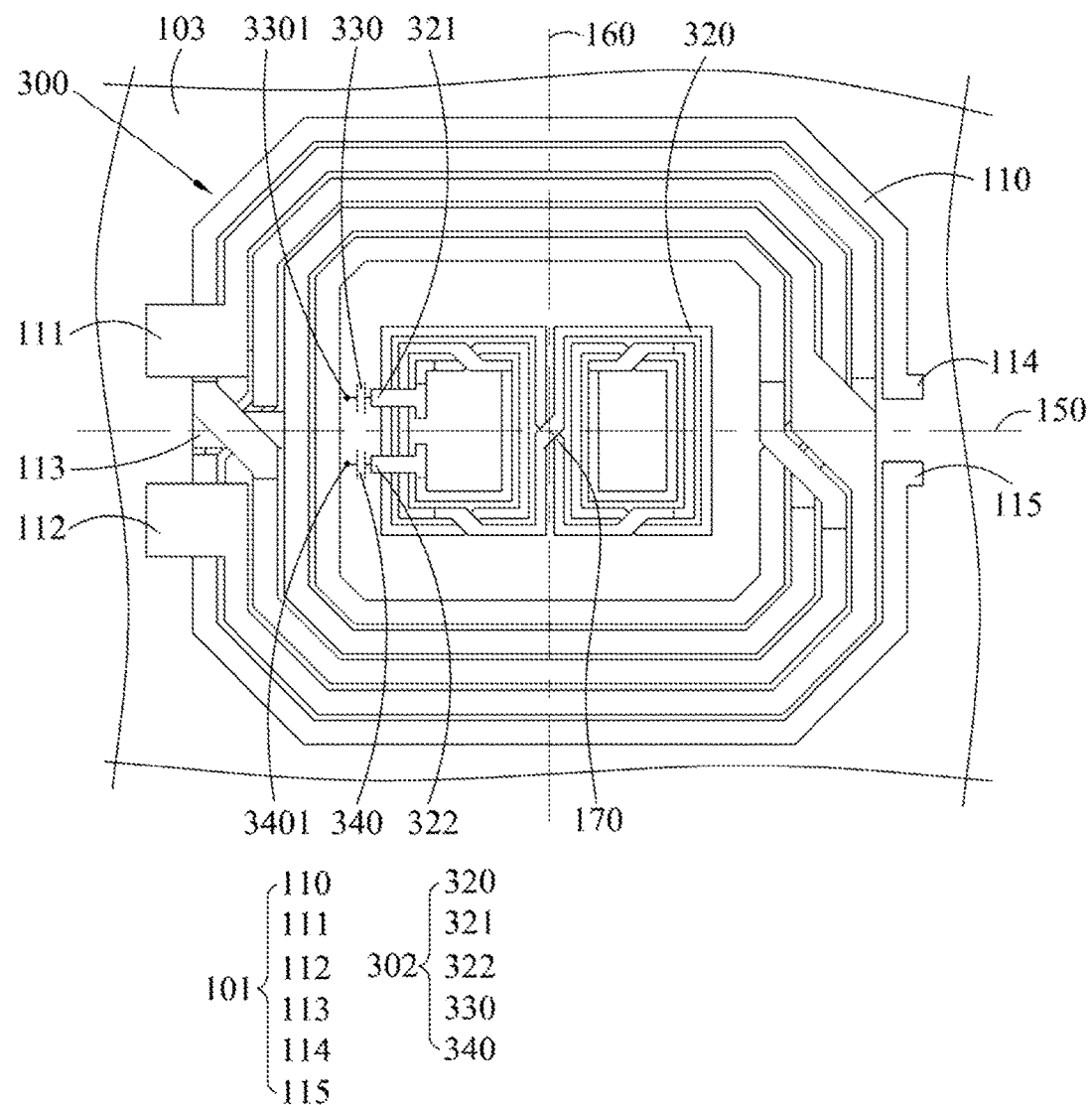
FIG. 3 illustrates a layout of the transceiver circuit according to the third embodiment of the present invention.

Referring to FIG. 3, which illustrates the layout of the transceiver circuit 300 according to the third embodiment of the present invention. The transceiver circuit 300 includes the signal coupler 101, the notch filter 302 and the substrate 103. The main difference between the first embodiment and the third embodiment is that the second conductive layer pattern 320 is arranged as a substantially two-circle coiled pattern on the substrate 103. That is, the second conductive layer pattern 320 may be coiled to form a substantially two-circle pattern, wherein the substrate 103 may include a multilayer structure and the first conductive layer pattern 110 or the second conductive layer pattern 320 may be configured across different layers of the multilayer structure. The multilayer structure of the transceiver circuit 300 is similar to the multilayer structure of the transceiver circuit 100 of the first embodiment. The way for connecting the circuits thereof is similar to the way used in the first embodiment as well.

The notch filter 302 includes the first capacitor 330 and the second capacitor 340. One end of the first capacitor 330 is electrically connected to the third end 321 and the other end 3301 of the first capacitor 330 is electrically connected to the first end 111 by the multilayer structure of the transceiver circuit 300. That is, the first capacitor 330 is electrically connected between the first end 111 and the third end 321. One end of the second capacitor 340 is electrically connected to the fourth end 322 and the other end 3401 of the second capacitor 340 is electrically connected to the second end 112 by the multilayer structure of the transceiver circuit 300. That is, the second capacitor 340 is electrically connected between the second end 112 and the fourth end 322.

As shown in FIG. 3, each of the first conductive layer pattern 110 and the second conductive layer pattern 320 is arranged as a substantially symmetrical pattern with respect to the first virtual axis 150. Each of the first conductive layer pattern 110 and the second conductive layer pattern 320 may also be arranged as a substantially symmetrical pattern with respect to the second virtual axis 160, wherein the second virtual axis 160 may be perpendicular to the first virtual axis 150.

The second conductive layer pattern 320, the first capacitor 330 and the second capacitor 340 of the notch filter 302 thereof are configured in the first conductive layer pattern 110, which reduces the use of additional regions of the chip in comparison with the prior art. That is, referring to FIG. 8, the notch filter 802 is configured outside the signal coupler 801 in the transceiver circuit 800, which uses additional regions of the chip. Moreover, because each of the first conductive layer pattern 110 and the second conductive layer pattern 320 is arranged as a substantially symmetrical pattern with respect to the first virtual axis 150 and the second virtual axis 160, the symmetry of structure of the transceiver circuit 300 is hence increased.

Figure 4:
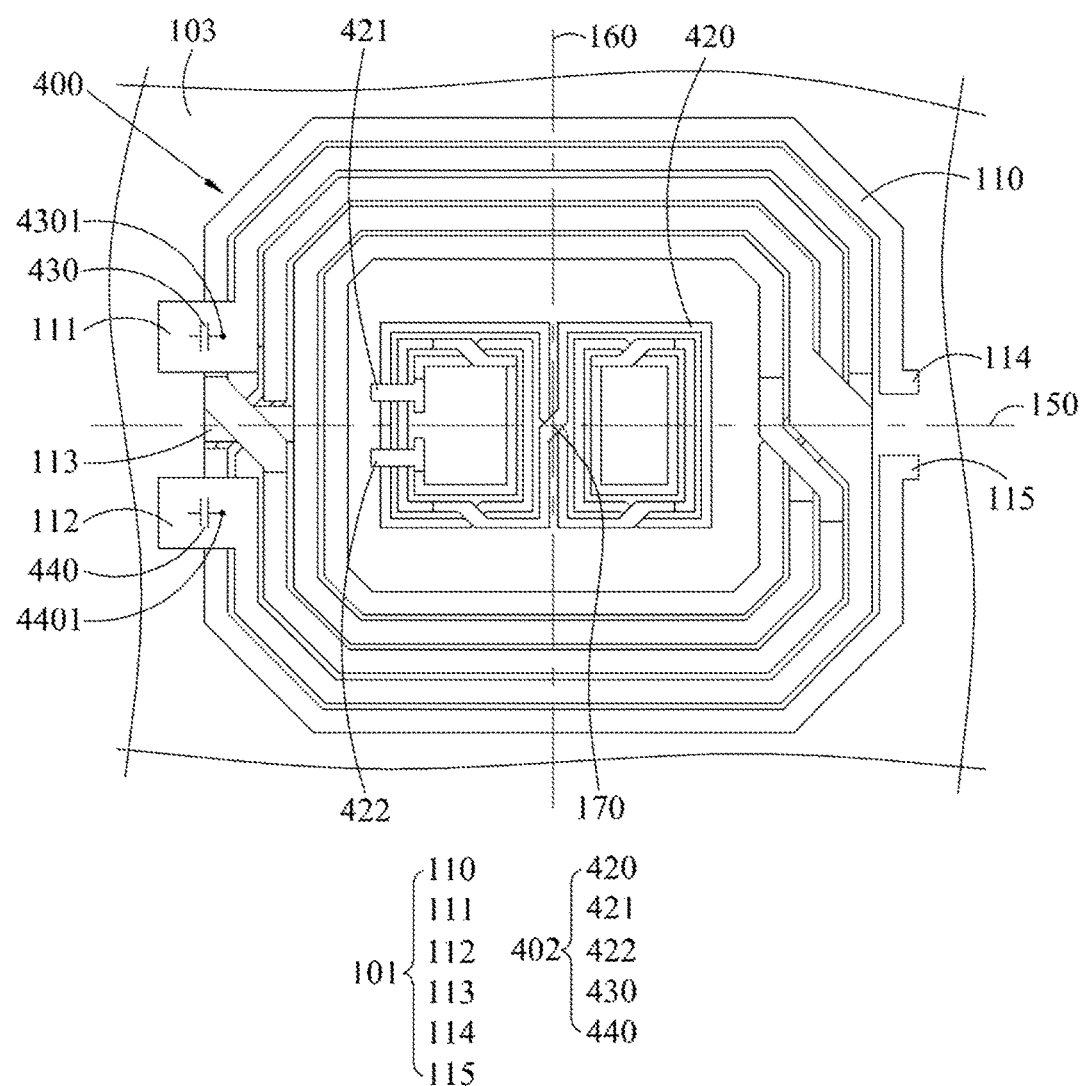
FIG. 4 illustrates a layout of the transceiver circuit according to the fourth embodiment of the present invention.

Referring to FIG. 4, which illustrates the layout of the transceiver circuit 400 according to the fourth embodiment of the present invention. The transceiver circuit 400 includes the signal coupler 101, the notch filter 402 and the substrate 103. The notch filter 402 is configured on the substrate 103 and includes the second conductive layer pattern 420, and the second conductive layer pattern 420 is coiled to form a substantially two-circle pattern on the substrate 103, which is similar to the configuration of the third embodiment. The substrate 103 thereof may include a multilayer structure and the first conductive layer pattern 110 or the second conductive layer pattern 420 may be configured across different layers of the multilayer structure, wherein the multilayer structure of the transceiver circuit 400 is similar to the foregoing multilayer structure of the transceiver circuit 100. Moreover, the difference between the transceiver circuit 400 of the fourth embodiment and the transceiver circuit 300 of the third embodiment is the difference of the structure of the notch filter 402 and that of the notch filter 302. In the fourth embodiment, the first capacitor 430 and the second capacitor 440 of the notch filter 402 are configured outside the first conductive layer pattern 110 and arranged as a substantially symmetrical pattern with respect to the first virtual axis 150. One end of the first capacitor 430 thereof is electrically connected to the first end 111 and the other end 4301 of the first capacitor 430 is electrically connected to the third end 421 by the multilayer structure of the transceiver circuit 400. That is, the first capacitor is electrically connected between the first end 111 and the third end 421. One end of the second capacitor 440 is electrically connected to the second end 112 and the other end 4401 of the second capacitor 440 is electrically connected to the fourth end 422 by the multilayer structure of the transceiver circuit 400. That is, the second capacitor 440 is electrically connected between the second end 112 and the fourth end 422.

In the foregoing embodiment (referring to FIG. 4), the second conductive layer pattern 420 of the notch filter 402 is configured in the first conductive layer pattern 110, which reduces the use of additional regions of the chip in comparison with the prior art. That is, referring to FIG. 8, the notch filter 802 is configured outside the signal coupler 801 in the transceiver circuit 800, which uses additional regions of the chip. Moreover, because each of the first conductive layer pattern 110 and the second conductive layer pattern 420 is arranged as a substantially symmetrical pattern with respect to the first virtual axis 150 and the second virtual axis 160, the symmetry of structure of the transceiver circuit 400 is hence increased.

Figure 5:
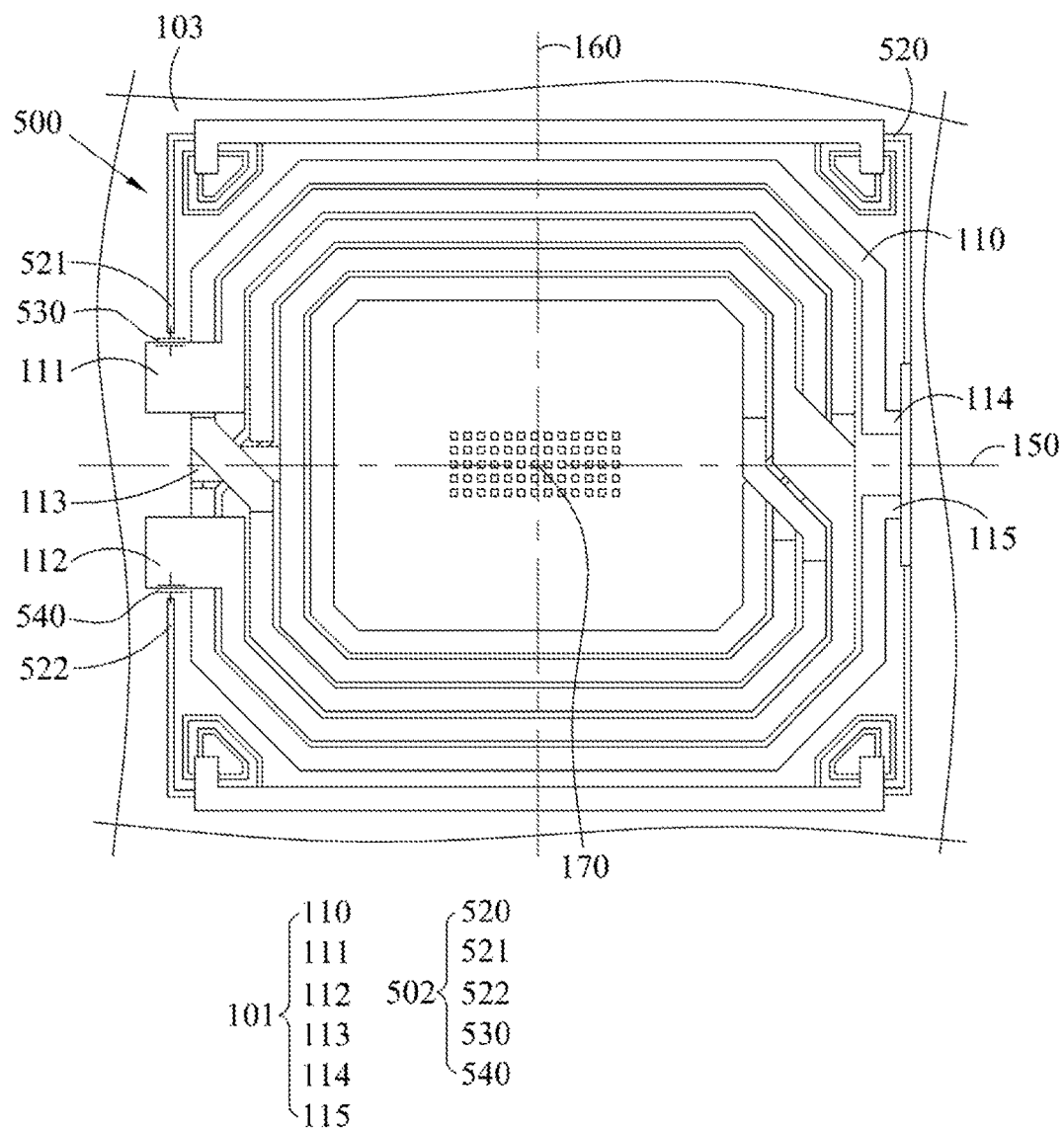
FIG. 5 illustrates a layout of the transceiver circuit according to the fifth embodiment of the present invention.

Referring to FIG. 5, which illustrates the layout of the transceiver circuit 500 according to the fifth embodiment of the present invention. The transceiver circuit 500 includes the signal coupler 101, the notch filter 502 and the substrate 103. The signal coupler 101 includes the first conductive layer pattern 110, which may be coiled to form to a circle pattern of a polygon, such as a rectangle, a hexagon or an octagon. The notch filter 502 is configured on the substrate 103 and includes the second conductive layer pattern 520. The coiled second conductive layer pattern 520 is configured on the substrate 103 and includes the third end 521 and the fourth end 522. The second conductive layer pattern 520 is configured around the first conductive layer pattern 110 in a plan view (top view), wherein the first conductive layer pattern 110 is arranged as a polygon and the second conductive layer pattern 520 includes circular patterns configured respectively outside four sides of the polygon and connected in series. The substrate 103 may include a multilayer structure and the first conductive layer pattern 110 and the second conductive layer pattern 520 may be configured across different layers of the multilayer structure. The multilayer structure of the transceiver circuit 500 is similar to the multilayer structure of the transceiver circuit 100 of the first embodiment.

The notch filter 520 includes the first capacitor 530 and the second capacitor 540. One end of the first capacitor 530 is electrically connected to the first end 111, and the other end of the first capacitor 530 is electrically connected to the third end 521. That is, the first capacitor 530 is electrically connected between the first end 111 and the third end 521. One end of the second capacitor 540 is electrically connected to the second end 112, and the other end of the second capacitor 540 is electrically connected to the fourth end 522. That is, the second capacitor 540 is electrically connected between the second end 112 and the fourth end 522.

Referring to FIG. 5, each of the first conductive layer pattern 110 and the second conductive layer pattern 520 may be arranged as a substantially symmetrical pattern with respect to the first virtual axis 150, and each of the first conductive layer pattern 110 and the second conductive layer pattern 520 may also be arranged as a substantially symmetrical pattern with respect to the second virtual axis 160, wherein the second virtual axis 160 may be perpendicular to the first virtual axis 150.

In the present embodiment, the first capacitor 530 and the second capacitor 540 may be configured outside the first conductive layer pattern 110. The first capacitor 530 is electrically connected between the first end 111 and the third end 521 and is configured outside the first conductive layer pattern 110. The second capacitor 540 is electrically connected the second end 112 and the fourth end 522 and is configured outside the first conductive layer pattern 110. The first capacitor 530 and the second capacitor 540 may be arranged as a substantially symmetrical pattern with respect to the first virtual axis 150.

In the foregoing embodiment (referring to FIG. 5), the second conductive layer pattern 520, the first capacitor 530 and the second capacitor 540 are configured around the first conductive layer pattern 110, and each of the first conductive layer pattern 110 and the second conductive layer pattern 520 is arranged as a substantially symmetrical pattern with respect to the first virtual axis 150 and the second virtual axis 160. The symmetry of structure of the transceiver circuit 500 is hence better than the prior art (referring to FIG. 8, the notch filter 802 is configured outside the signal coupler 801 in the transceiver circuit 800).

The application of the foregoing transceiver circuit often includes a power amplifier PA electrically connected to the transceiver circuit (referring to FIG. 9). The RF characteristics of the transceiver circuit 800 electrically connected to a power amplifier are shown in column 2 (Control group) of TAB. 1, the RF characteristics of the transceiver circuit 100 or 200 electrically connected to the power amplifier are shown in column 3 (First or second embodiment) of TAB. 1, the RF characteristics of the transceiver circuit 300 or 400 electrically connected to the power amplifier are shown in column 4 (Third or fourth embodiment) of TAB. 1, the RF characteristics of the transceiver circuit 500 electrically connected to the power amplifier are shown in column 5 (Fifth embodiment) of TAB. 1, and the RF characteristics of the signal coupler 101 electrically connected to a power amplifier are shown in column 2 (No notch filter) of TAB 1.

TABLE 1

|  | No notch filter | Control group | First or second embodiment | Third or fourth embodiment | Fifth embodiment |
| --- | --- | --- | --- | --- | --- |
| $P_{1dB}/P_{sat}$ (dBm) | 26.28/28.23 | 26.28/28.3 | 26.23/28.35 | 26.3/28.3 | 26.28/28.31 |
| Gain (dB) | 30.77 | 30.8 | 30.7 | 30.7 | 30.8 |
| AMPM (deg) 25 dBm | 2.36 | 2.675 | 2.51 | 2.39 | 2.68 |
| $2^{nd}/3^{rd}$ (dBm) @18dBm | −42.1/−15 | −41.7/−23 | −44.78/−23.73 | −45/−24 | −41.7/−23 |
| ID_PA (mA) DC/18dBm | 108.6/169 | 108.6/169 | 108.6/168.35 | 108.6/169 | 108.6/169 |

In TAB. 1, column 1 shows the RF characteristics of the circuit of FIG. 9 when the notch filter 902 is omitted. In TAB. 1, the term "$P_{sat}$" represents the maximum output power of the power amplifier PA. The gain value (Gain) of the power amplifier PA will reduce for high output power. The term "$P_{1dB}$" represents the output power of the power amplifier PA when the gain value reduces 1 dB. The term "AMPM (deg) 25 dBm" represents the amount of phase distortion (PM) due to signal amplitude (AM) when the output power is 25 dBm. The term "2nd/3rd (dBm) @18 dBm" represents the dBm values of the 2nd/3rd harmonics when the output power is 18 dBm. The term "ID_PA (mA) DC/18 dBm" represents the current (DC) of the power amplifier PA when the power amplifier PA does not input and output power, and represents the current (18 dBm) of the power amplifier PA when the output power of the power amplifier PA is 18 dBm.

Referring to TAB. 1, the power of the third harmonics is −15 dBm when the notch filter 902 of the circuit of FIG. 9 is omitted. When the power amplifier PA connects to the transceiver circuit 800, the power of the third harmonics reduces to −23 dBm. When the power amplifier PA connects to the transceiver circuit 100 or 200, the power of the third harmonics reduces to −23.73 dBm. When the power amplifier PA connects to the transceiver circuit 300 or 400, the power of the third harmonics reduces to −24 dBm. When the power amplifier PA connects to the transceiver circuit 500, the power of the third harmonics reduces to −23 dBm. That is, the notch filter 802, 102, 202, 302, 402 or 502 which corresponds to the notch filter 902 further reduce the power of the third harmonics by about 8 dBm to about 9 dBm. Besides, the transceiver circuit 100 of the first embodiment, the transceiver circuit 200 of the second embodiment, the transceiver circuit 300 of the third embodiment, the transceiver circuit 400 of the fourth embodiment and the transceiver circuit 500 of the fifth embodiment all reduce the use of additional regions of the chip and increase the symmetry of structure of the chip in comparison with the transceiver circuit 800 of the control group. Moreover, referring to TAB. 1, when the power amplifier PA is electrically connected to the transceiver circuit 100 of the first embodiment, the transceiver circuit 200 of the second embodiment, the transceiver circuit 300 of the third embodiment, the transceiver circuit 400 of the fourth embodiment, the transceiver circuit 500 or the transceiver circuit 800 of the control group, the other RF characteristics in TAB. 1 are substantially the same with that of the circuit of FIG. 9 without the notch filter 902.

Figure 11:
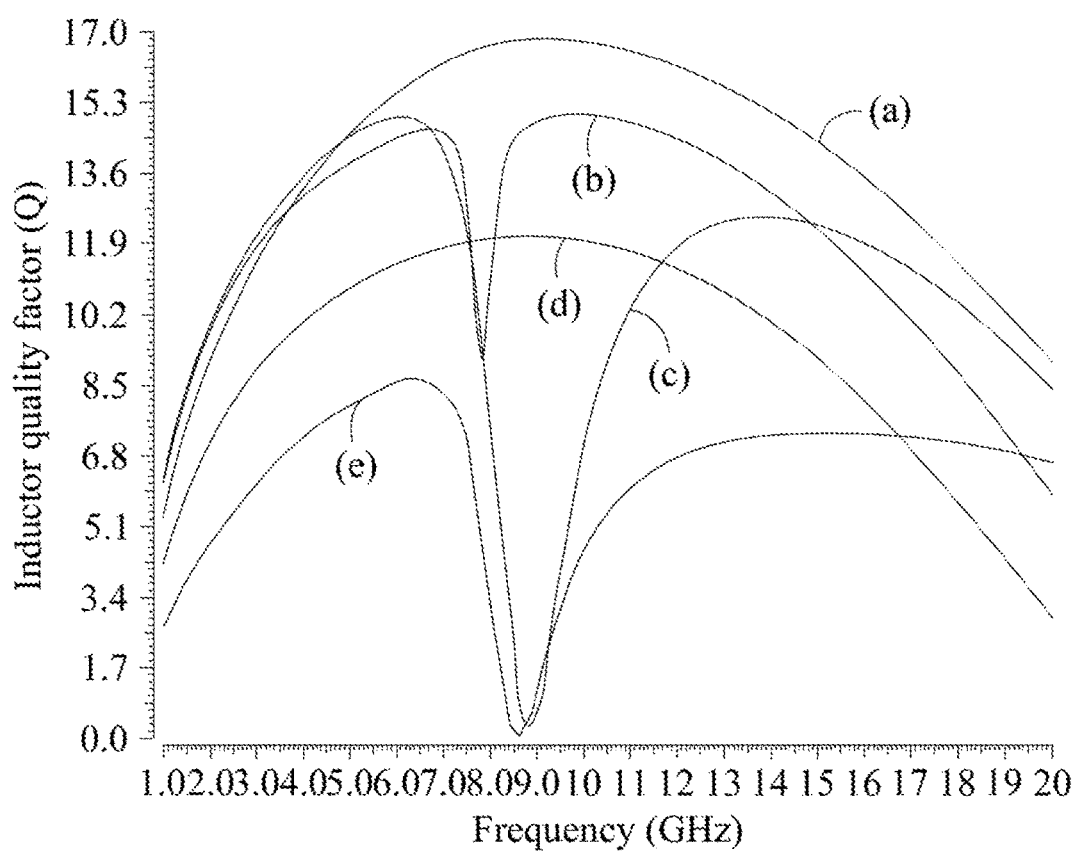
FIG. 11 illustrates the graph of the inductor quality factor (Q) of the notch filters of the first embodiment to the fifth embodiment of the present invention.

Referring to FIG. 11, which illustrates the graph of the inductor quality factor (Q) of the notch filters of the first embodiment to the fifth embodiment of the present invention. The curve (a) represents the inductor quality factor (Q) of each of the notch filters 102, 202, 302, 402 or 502 configured alone. The curve (b) represents the inductor quality factor (Q) of the notch filter 802 of the transceiver circuit 800 of the control group. The curve (c) represents the inductor quality factor (Q) of the notch filter 102 of the transceiver circuit 100 of the first embodiment or that of the notch filter 202 of the transceiver circuit 200 of the second embodiment. The curve (d) represents the inductor quality factor (Q) of the notch filter 302 of the transceiver circuit 300 of the third embodiment or that of the notch filter 402 of the transceiver circuit 400 of the fourth embodiment. The curve (e) represents the inductor quality factor (Q) of the notch filter 502 of the transceiver circuit 500 of the fifth embodiment.

Referring to FIG. 11, it should be understood that the inductor quality factors (Q) of the notch filters may be influenced by the signal coupler when each of the notch filter 102, 202, 302, 402 or 502 is configured in the signal coupler or around the signal coupler. For the third harmonics of the application of WiFi 2.4 GHz (about 7.2 GHz to about 7.5 GHz), the notch filters 102, 202, 302, 402 and 502 which are configured in the signal coupler 101 or around the signal coupler 101 all have a good inductor quality factor (Q). Especially, the inductor quality factor (Q) of the notch filter 302 of the transceiver circuit 300 or that of the notch filter 402 of the transceiver circuit 400 is less influenced by the signal coupler 101.

Referring to TAB. 1 and FIG. 11, the simulation verifies that the transceiver circuits disclosed in the present invention provide good performance of filtering the third harmonics, reduce the use of additional regions of the chip in comparison with the prior art and increase the symmetry of structure of the chip.

Figure 6:
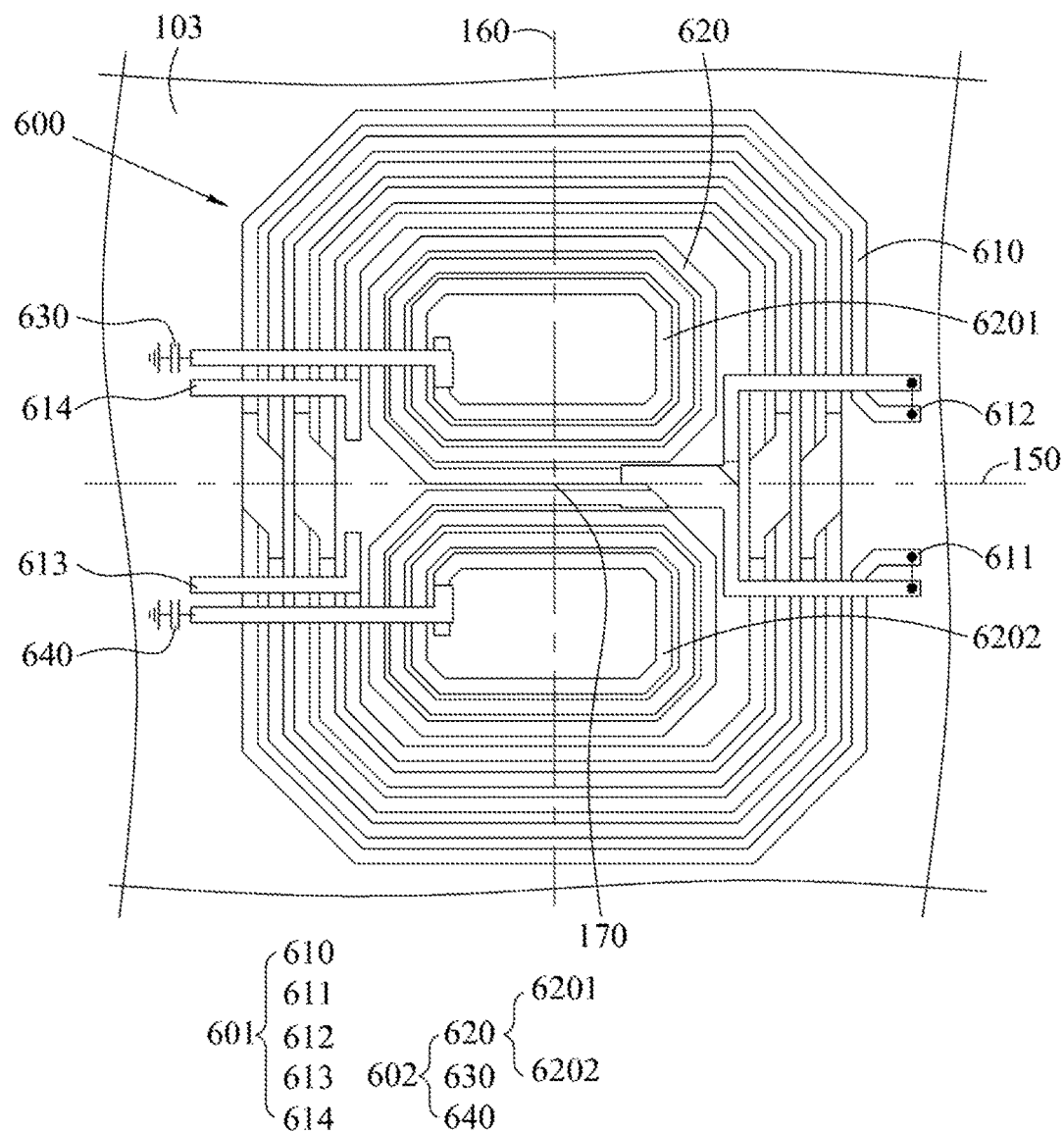
FIG. 6 illustrates a layout of the transceiver circuit according to the sixth embodiment of the present invention.
Figure 7:
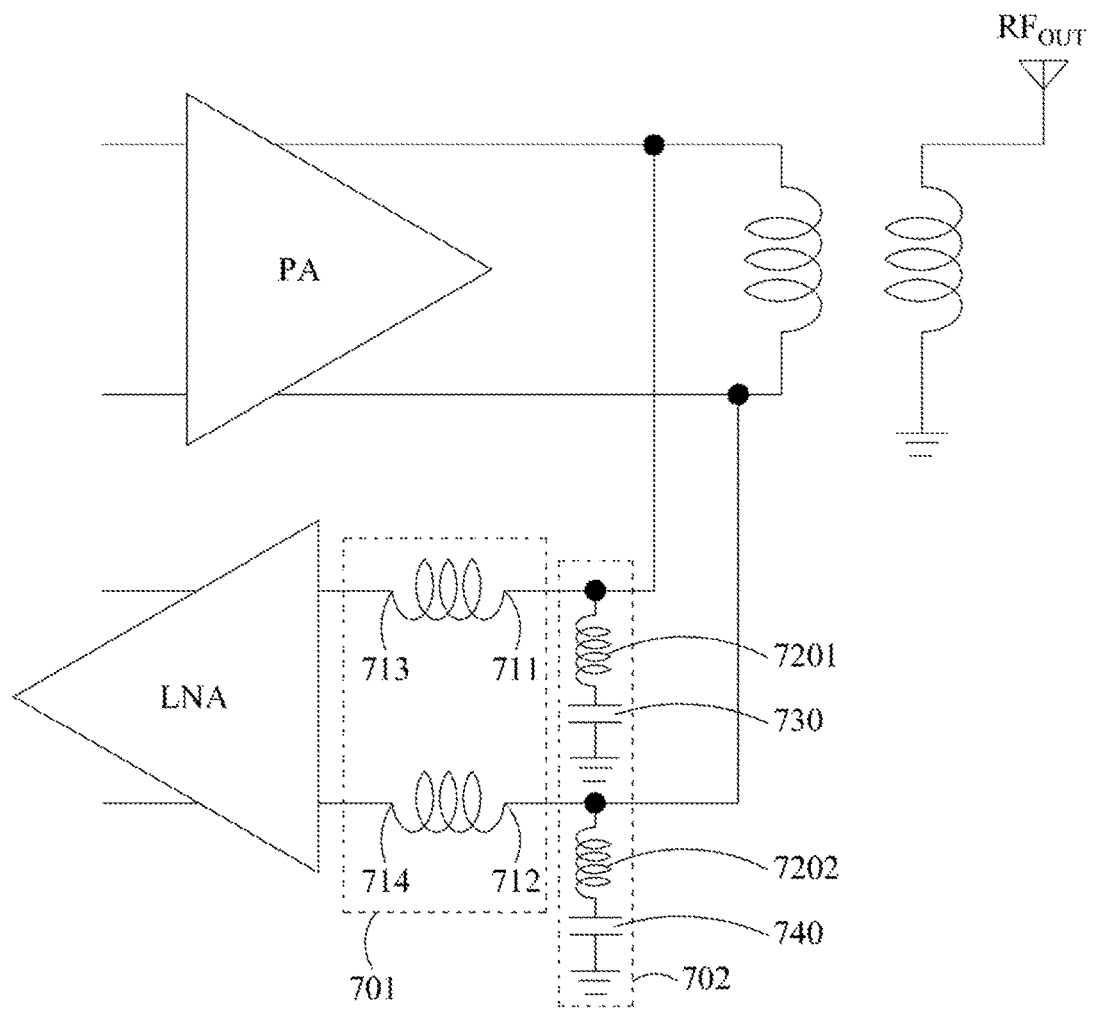
FIG. 7 illustrates a schematic diagram of a circuit including the transceiver circuit illustrated in FIG. 6.

Referring to FIGS. 6 and 7, FIG. 6 illustrates the layout of the transceiver circuit according to the sixth embodiment of the present invention, and FIG. 7 illustrates a schematic diagram of a circuit including the transceiver circuit illustrated in FIG. 6. The transceiver circuit 600 includes the signal coupler 601, the notch filter 602 and the substrate 103. The signal coupler 601 is configured on the substrate 103 and includes the first conductive layer pattern 601. The coiled first conductive layer pattern 610 is configured on the substrate 103 and includes the first end 611, the second end 612, the eighth end 613 and the ninth end 614.

In FIG. 7, LNA is a low noise amplifier (LNA), PA is a power amplifier and the signal coupler 701 corresponds to the signal coupler 601 of FIG. 6. The first end 711, the second end 712, the eighth end 713 and the ninth end 714 respectively corresponds to the first end 611, the second end 612, the eighth end 613 and the ninth end 614 of FIG. 6.

Referring to FIG. 6, the notch filter 602 is configured on the substrate 103 and includes the second conductive layer pattern 620. The second conductive layer pattern 620 is configured in the first conductive layer pattern 610 in a plan view (top view). The coiled second conductive layer pattern 620 is configured on the substrate 103 and includes the first inductor 6201 and the second inductor 6202 which are both arranged as a circle pattern, the first capacitor 630 and the second capacitor 640 on the substrate 103. The substrate 103 may include a multilayer structure and the first conductive layer pattern 610 and/or the second conductive layer pattern 620 may be configured across different layers of the multilayer structure. The first inductor 6201 is electrically connected between the first end 611 and the first capacitor 630, and the second inductor 6202 is electrically connected between the second end 612 and the second capacitor 640 as shown in FIG. 6.

Referring to FIG. 7 again, the first inductor 7201, the second inductor 7202, the first capacitor 730 and the second capacitor 740 respectively correspond to the first inductor 6201, the second inductor 6202, the first capacitor 630 and the second capacitor 640 of FIG. 6. Each of the first conductive layer pattern 610 and the second conductive layer pattern 620 may be arranged as a substantially symmetrical pattern with respect to the first virtual axis 150. Each of the first conductive layer pattern 610 and the second conductive layer pattern 620 may also be arranged as a substantially symmetrical pattern with respect to the second virtual axis 160, and the second virtual axis 160 may be perpendicular to the first virtual axis 150 as shown in FIG. 6.

In the foregoing embodiment (referring to FIG. 6), the second conductive layer pattern 620 of the notch filter 602 is configured in the first conductive layer pattern 610, which reduces the use of additional regions of the chip in comparison with the prior art. That is, referring to FIG. 8, the notch filter 802 is configured outside the signal coupler 801 in the transceiver circuit 800, which uses additional regions of the chip. Further, each of the first conductive layer pattern 610 and the second conductive layer pattern 620 is arranged as a substantially symmetrical pattern with respect to the first virtual axis 150 and the second virtual axis 160, which remains or increase the symmetry of structure of the transceiver circuit 600.

Referring to TAB. 2, which shows the RF characteristics of the power amplifier PA electrically connected to the transceiver circuit 600, wherein the first column of TAB. 2 shows the RF characteristics of the circuit shown in FIG. 7 without the notch filter 702 and the second column of TAB. 2 shows the RF characteristics of the circuit shown in FIG. 7 in which the signal coupler 701 and the notch filter 702 are configured in the same way as the sixth embodiment.

TABLE 2

|  | No notch filter | Sixth embodiment |
|---|---|---|
| $P_{1dB}/P_{sat}$ (dBm) | 25.7/28.2 | 25.7/28.2 |
| Gain (dB) | 34 | 34 |
| AMPM (deg) 25 dBm | 4 | 4 |
| $2^{nd}/3^{rd}$ (dBm) @18dBm | −26/−29 | −31/−29 |

TABLE 2-continued

|  | No notch filter | Sixth embodiment |
|---|---|---|
| ID_PA (mA) DC/18dBm | 110/170 | 110/170 |

Referring to TAB. 2, the power of the second harmonics is −26 dBm when the notch filter 702 of the circuit of FIG. 7 is omitted. When the signal coupler 701 and the notch filter 702 are configured in the same way as the sixth embodiment, the power of the second harmonics reduces to −31 dBm. In other words, the notch filter 602 corresponding to the notch filter 702 reduces the power of the second harmonics by about 5 dBm. Apparently, when the notch filter 602 is configured in a pre-set passive component such as the signal coupler 601 disclosed in the sixth embodiment, the performance of filtering the second harmonics is improved, the symmetry of structure of the chip is maintained or even improved and the use of additional regions of the chip is avoided. It should be understood that since the natural frequency of vibration of the signal coupler 601 is much higher than the operating frequency of the notch filter 602, the influence of the signal coupler 601 on the inductor quality factor Q of the notch filter 602 may be omitted.

Referring to TAB. 2, the simulation verifies that the transceiver circuits disclosed in the present invention provide good performance of filtering the second harmonics, maintain and even improve the symmetry of structure of the chip, and avoid the use of additional regions of the chip.

Figure 10:
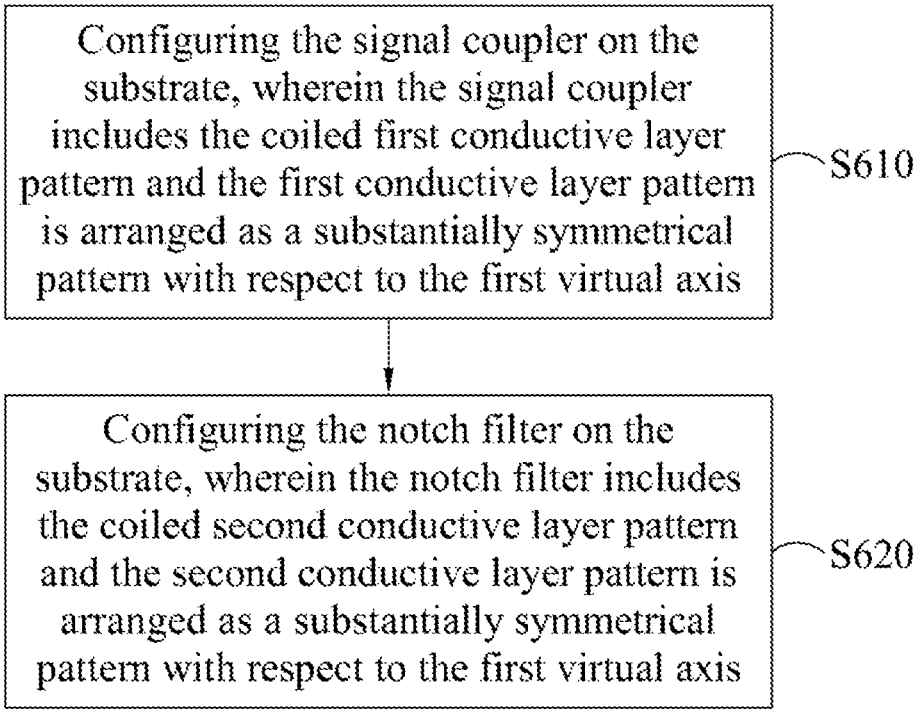
FIG. 10 illustrates the flow chart of the method of transceiver circuit configuration of an embodiment of the present invention.

Referring to FIG. 10, which illustrates the flow chart of the method of transceiver circuit configuration of an embodiment of the present invention. The method includes two steps, wherein the first step S610 relates to the configuration of the signal coupler and the second step S620 relates to the configuration of the notch filter.

The first step S610 relates to the configuration of the signal coupler. Specifically, the first step S610 includes: configuring the signal coupler on the substrate, the signal coupler including the coiled first conductive layer pattern, and the first conductive layer pattern being arranged as a substantially symmetrical pattern with respect to the first virtual axis.

The second step S620 relates to the configuration of the notch filter. Specifically, the second step S620 includes: configuring the notch filter on the substrate, the notch filter including the coiled second conductive layer pattern, and the second conductive layer pattern be arranged as a substantially symmetrical pattern with respect to the first virtual axis.

The above description is merely illustrative and not restrictive. Any equivalent modification or change without departing from the spirit and scope of the present disclosure should be included in the appended claims.

What is claimed is:

1. A transceiver circuit, comprising:
a substrate;
a signal coupler configured on the substrate and comprising a coiled first conductive layer pattern; and
a notch filter configured on the substrate and comprising a coiled second conductive layer pattern;
wherein each of the coiled first conductive layer pattern and the coiled second conductive layer pattern is arranged as a substantially symmetrical pattern with respect to a first virtual axis;
wherein the coiled first conductive layer pattern is arranged as a substantially circular pattern and the coiled second conductive layer pattern is arranged as a substantially two-circle pattern;
wherein the substantially two-circle pattern comprises two circle patterns disposed apart from and adjacent to each other.

2. The transceiver circuit of claim 1, wherein each of the coiled first conductive layer pattern and the coiled second conductive layer pattern is arranged as a substantially symmetrical pattern with respect to a second virtual axis perpendicular to the first virtual axis.

3. The transceiver circuit of claim 2, wherein the coiled second conductive layer pattern is configured inside the coiled first conductive layer pattern.

4. The transceiver circuit of claim 3, wherein the coiled first conductive layer pattern and the coiled second conductive layer pattern are respectively arranged as a substantially circular pattern with a same geometric center.

5. The transceiver circuit of claim 3, wherein the notch filter comprising a first capacitor and a second capacitor; the coiled first conductive layer pattern comprising a first end and a second end; the coiled second conductive layer pattern comprising a third end and a fourth end; the first capacitor being electrically connected between the first end and the third end; and the second capacitor being electrically connected between the second end and the fourth end.

6. The transceiver circuit of claim 3, wherein the notch filter comprising a first capacitor and a second capacitor; the coiled first conductive layer pattern comprising a first end and a second end; the substantially two-circle pattern providing a first inductor and a second inductor; the first inductor being electrically connected between the first end and the first capacitor; and the second inductor being electrically connected between the second end and the second capacitor.

7. A transceiver circuit, comprising:
a substrate;
a signal coupler configured on the substrate and comprising a coiled first conductive layer pattern; and
a notch filter configured on the substrate and comprising a coiled second conductive layer pattern;
wherein each of the coiled first conductive layer pattern and the coiled second conductive layer pattern is arranged as a substantially symmetrical pattern with respect to a first virtual axis;
wherein the coiled second conductive layer pattern is configured around the coiled first conductive layer pattern.

8. The transceiver circuit of claim 7, wherein the coiled first conductive layer pattern is arranged as a substantially circular pattern as a polygon and the coiled second conductive layer pattern comprises serially connected circular patterns configured respectively outside at least two sides of the polygon.

9. A method of transceiver circuit configuration, comprising:
configuring a signal coupler on a substrate, the signal coupler comprising a coiled first conductive layer pattern; and
configuring a notch filter on the substrate, the notch filter comprising a coiled second conductive layer pattern;
wherein each of the coiled first conductive layer pattern and the coiled second conductive layer pattern is arranged as a substantially symmetrical pattern with respect to a first virtual axis;

wherein the coiled first conductive layer pattern is arranged as a substantially circular pattern and the coiled second conductive layer pattern is arranged as a substantially two-circle pattern;

wherein the substantially two-circle pattern comprises two circle patterns disposed apart from and adjacent to each other.

10. The method of transceiver circuit configuration of claim 9, wherein each of the coiled first conductive layer pattern and the coiled second conductive layer pattern is arranged as a substantially symmetrical pattern with respect to a second virtual axis perpendicular to the first virtual axis.

11. The method of transceiver circuit configuration of claim 10, wherein the coiled second conductive layer pattern is configured inside the coiled first conductive layer pattern.

12. The method of transceiver circuit configuration of claim 11, wherein the coiled first conductive layer pattern and the coiled second conductive layer pattern are respectively arranged as a substantially circular pattern with a same geometric center.

13. The method of transceiver circuit configuration of claim 11, wherein the substrate comprising a multilayer structure and the coiled first conductive layer pattern and the coiled second conductive layer pattern are configured across different layers of the multilayer structure.

14. The method of transceiver circuit configuration of claim 11, wherein the coiled first conductive layer pattern comprising a first end and a second end; the coiled second conductive layer pattern comprising a third end and a fourth end; the method further comprising: electrically connecting a first capacitor between the first end and the third end and electrically connecting a second capacitor between the second end and the fourth end.

15. The method of transceiver circuit configuration of claim 11, wherein the coiled first conductive layer pattern comprising a first end and a second end; the substantially two-circle pattern providing a first inductor and a second inductor; the method further comprising: configuring a first capacitor and a second capacitor such that the first inductor is electrically connected between the first end and the first capacitor and the second inductor is electrically connected between the second end and the second capacitor.

16. A method of transceiver circuit configuration:
configuring a signal coupler on a substrate, the signal coupler comprising a coiled first conductive layer pattern; and
configuring a notch filter on the substrate, the notch filter comprising a coiled second conductive layer pattern;
wherein each of the coiled first conductive layer pattern and the coiled second conductive layer pattern is arranged as a substantially symmetrical pattern with respect to a first virtual axis;
wherein the coiled second conductive layer pattern is configured around the coiled first conductive layer pattern.

17. The method of transceiver circuit configuration of claim 16, wherein the coiled first conductive layer pattern is arranged as a substantially circular pattern as a polygon and the coiled second conductive layer pattern comprises serially connected circular patterns configured respectively outside at least two sides of the polygon.

18. The method of transceiver circuit configuration of claim 16, wherein the coiled first conductive layer pattern is arranged as a substantially circular pattern as an octagon; the coiled second conductive layer pattern comprising four serially connected circular patterns configured respectively outside two sets of sides of the octagon which are parallel and facing each other.

* * * * *